(12) United States Patent
Liu et al.

(10) Patent No.: US 9,012,279 B2
(45) Date of Patent: Apr. 21, 2015

(54) SIGE HBT AND METHOD OF MANUFACTURING THE SAME

(75) Inventors: Donghua Liu, Shanghai (CN); Wenting Duan, Shanghai (CN); Wensheng Qian, Shanghai (CN); Jun Hu, Shanghai (CN); Jing Shi, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/613,236

(22) Filed: Sep. 13, 2012

(65) Prior Publication Data
US 2013/0113020 A1 May 9, 2013

(30) Foreign Application Priority Data
Nov. 3, 2011 (CN) .......................... 2011 1 0342684

(51) Int. Cl.
*H01L 21/8238* (2006.01)
*H01L 29/66* (2006.01)
*H01L 29/737* (2006.01)
*H01L 29/08* (2006.01)

(52) U.S. Cl.
CPC ...... *H01L 29/66242* (2013.01); *H01L 29/7371* (2013.01); *H01L 29/0821* (2013.01)

(58) Field of Classification Search
CPC .................. H01L 29/66242; H01L 29/0821; H01L 29/7371
USPC .......................... 438/320, 207; 257/E21.371
See application file for complete search history.

(56) References Cited

U.S. PATENT DOCUMENTS

| 2004/0157387 A1* | 8/2004 | Yi et al. ......................... 438/202 |
| 2012/0091509 A1* | 4/2012 | Liu et al. ....................... 257/197 |

* cited by examiner

*Primary Examiner* — Hsin-Yi Hsieh
(74) *Attorney, Agent, or Firm* — MKG, LLC

(57) ABSTRACT

A SiGe HBT is disclosed, which includes: a silicon substrate; shallow trench field oxides formed in the silicon substrate; a pseudo buried layer formed at bottom of each shallow trench field oxide; a collector region formed beneath the surface of the silicon substrate, the collector region being sandwiched between the shallow trench field oxides and between the pseudo buried layers; a polysilicon gate formed above each shallow trench field oxide having a thickness of greater than 150 nm; a base region on the polysilicon gates and the collector region; emitter region isolation oxides on the base region; and an emitter region on the emitter region isolation oxides and a part of the base region. The polysilicon gate is formed by gate polysilicon process of a MOSFET in a CMOS process. A method of manufacturing the SiGe HBT is also disclosed.

10 Claims, 9 Drawing Sheets

SIGE HBT AND METHOD OF MANUFACTURING THE SAME

CROSS-REFERENCE TO RELATED APPLICATIONS

This application claims the priority of Chinese patent application number 201110342684.X, filed on Nov. 3, 2011, the entire contents of which are incorporated herein by reference.

TECHNICAL FIELD

The present invention relates to the field of semiconductor manufacturing, and more particularly, to a SiGe HBT and its manufacturing method.

BACKGROUND ART

As demands for good performance, low noise and low cost RF components in modem communications increase, conventional Si-based devices can no longer meet the new requirements of performance specifications, output power and linearity, and thus have been replaced by power SiGe HBTs (Silicon-Germanium Heterojunction Bipolar Transistors) which are playing an important role in power amplifiers having a wider band and higher frequency.

Although the frequency performance of SiGe HBTs is not as good as GaAs-based devices, SiGe HBTs have well solved the heat dissipation problem of power amplifiers due to their better thermal conductivities and substrate mechanical properties. Additionally, SiGe HBTs have better linearity and are better integrated. Since SiGe HBTs belong to Si-based technology, they have good compatibility with CMOS (Complementary Metal Oxide Semiconductor) processes. SiGe BiCMOS process has provided a great convenience for the integration of power amplifiers and logic control circuits and has also reduced process costs.

At present, SiGe HBTs have been widely used as high-frequency, high-power power amplifier devices in wireless communication products, such as power amplifiers and low noise amplifiers in mobile phones. The output power of an RF power amplifier can be effectively improved by increasing its operating current or operating voltage within its normal operating range. In addition, for a circuit employing a SiGe HBT, improving the voltage withstanding capability of the SiGe HBT would allow the circuit to obtain a lower current under the same power, so as to reduce the power consumption. Therefore, it has been a most important technical problem to reduce the base region resistance of a SiGe HBT so as to reduce the power consumption and increase the maximum oscillation frequency of the device.

However, in the prior art, the SiGe epitaxial layer in the base region of a SiGe HBT has been made thinner and thinner, for example, less than 50 nm, to obtain a higher cut-off frequency of the device. A thin base region will lead to an increase in the base region resistance, which is against the improvement of other performances of the device.

SUMMARY OF THE INVENTION

An objective of the present invention is to provide a SiGe HBT to reduce the base region resistance of the SiGe HBT so as to reduce the power consumption and improve the maximum oscillation frequency of the device while maintain a higher cut-off frequency. To this end, another objective of the present invention is to provide a method of manufacturing the SiGe HBT.

To achieve the above objective, the present invention provides a SiGe HBT which includes: a silicon substrate; shallow trench field oxides formed in the silicon substrate; a pseudo buried layer formed at bottom of each shallow trench field oxide; a collector region formed beneath a surface of the silicon substrate, wherein the collector region is sandwiched between the shallow trench field oxides and between the pseudo buried layers; a polysilicon gate formed above each shallow trench field oxide having a thickness of greater than 150 nm; a base region formed by a SiGe epitaxial layer formed on the polysilicon gates and the collector region; emitter region isolation oxides formed on a part of the base region on the collector region; and an emitter region formed on the emitter region isolation oxides and a part of the base region between emitter region isolation oxides.

To achieve the another objective, the present invention further provides a method of manufacturing SiGe HBT, which includes: form shallow trenches in a silicon substrate; form a pseudo buried layer at bottom of each shallow trench; fill an oxide into each shallow trench to form shallow trench field oxides; form a polysilicon gate with a thickness of greater than 150 nm above each shallow trench field oxide; form a collector region beneath a surface of the silicon substrate, wherein the collector region is sandwiched between the shallow trench field oxides and between the pseudo buried layers; form a base region by growing a SiGe epitaxial layer on the polysilicon gates and the collector region; form emitter region isolation oxides on a part of the base region on the collector region; and form an emitter region on the emitter region isolation oxides and a part of the base region between the emitter region isolation oxides.

The method of manufacturing SiGe HBT of the present invention is compatible with CMOS processes. The thickness of the extrinsic base region is increased and hence the base region resistance is reduced by forming polysilicon gates having a thickness of greater than 150 nm using the process for forming polysilicon gates in a MOSFET, while a thin SiGe epitaxial layer is maintained to keep a high cut-off frequency. Further, instead of using an even N-type buried layer typically formed in a conventional device, the SiGe HBT of the present invention only forms buried layers (referred to as pseudo buried layers) under the field oxides on both sides of the active area, and then heavily dopes the pseudo buried layers with N-type impurities, and forms deep contact holes directly connecting to the pseudo buried layers in the field oxides to pick up the collector region, so there is no need to use the active area to pick up the electrode of the buried layer, and the size and area of the device is extremely reduced. The SiGe HBT and its manufacturing method of the present invention can reduce the base region resistance of the SiGe HBT so as to reduce the power consumption and increase the maximum oscillation frequency of the device without affecting its cut-off frequency.

BRIEF DESCRIPTION OF THE DRAWINGS

The present invention will be described and specified in combination with the drawings and embodiments below.

DETAILED DESCRIPTION

Figure 1:
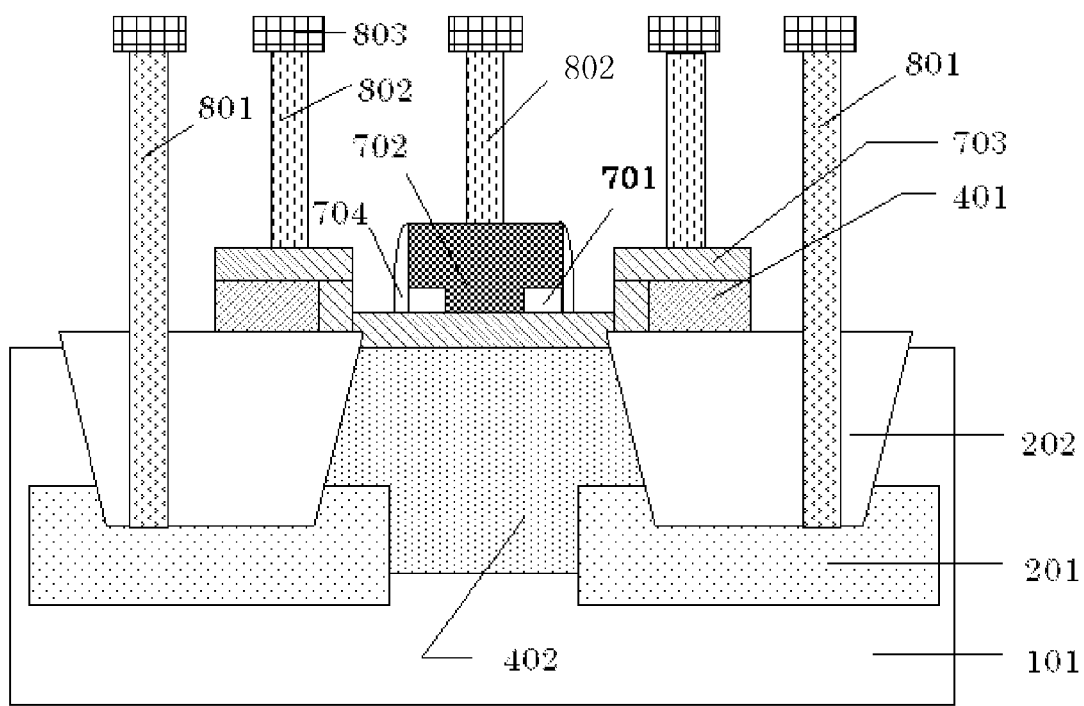
FIG. 1 is a schematic diagram of the SiGe HBT of the present invention.

FIG. 1 is a schematic diagram of the SiGe HBT of the present invention. As shown in FIG. 1, a collector region 402 and pseudo buried layers 201 are formed in a silicon substrate 101. A shallow trench field oxide 202 is formed above each pseudo buried layer 201. A polysilicon gate 401 is formed above each shallow trench field oxide 202. A base region 703 is formed on the polysilicon gates 401 and the collector region 402. Emitter region isolation oxides 701 are formed on the base region 703 and are located above the collector region 402. An emitter region 702 is formed on the emitter region isolation oxides 701 and a part of the base region 703 between the emitter region isolation oxides 701. Spacers 704 are formed on sidewalls of the emitter region 702 and emitter region isolation oxides 701. The collector region 402 is adjacent to the shallow trench field oxides 202 and the pseudo buried layers 201. Each pseudo buried layer 201 is picked up by a deep contact hole 801 and is connected to a metal wire 803. The base region 703 and the emitter region 702 are picked up by contact holes 802 and are connected to the respective metal wires 803.

Figure 2:
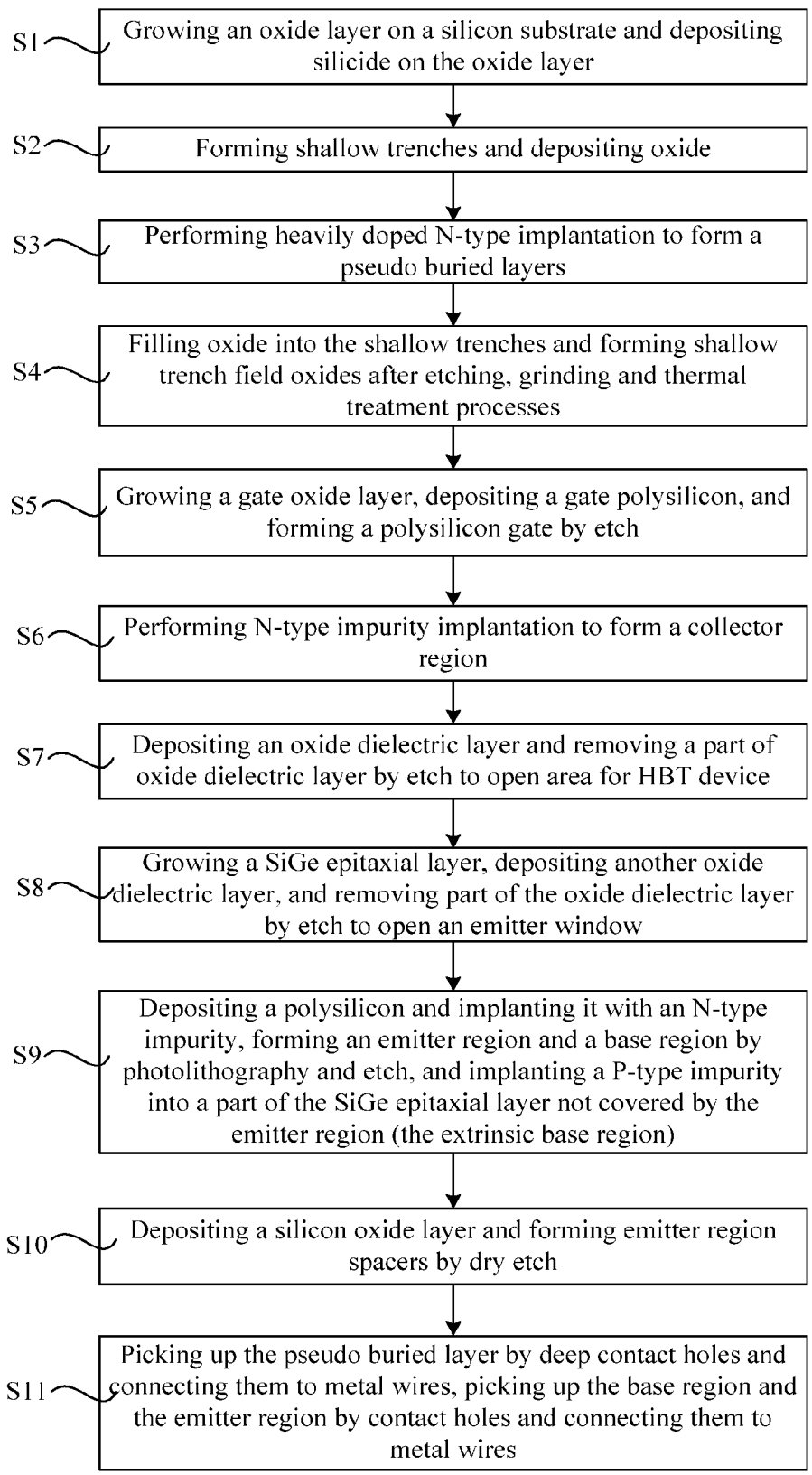
FIG. 2 is a flow diagram of the manufacturing method of SiGe HBT of the present invention.
Figure 3:
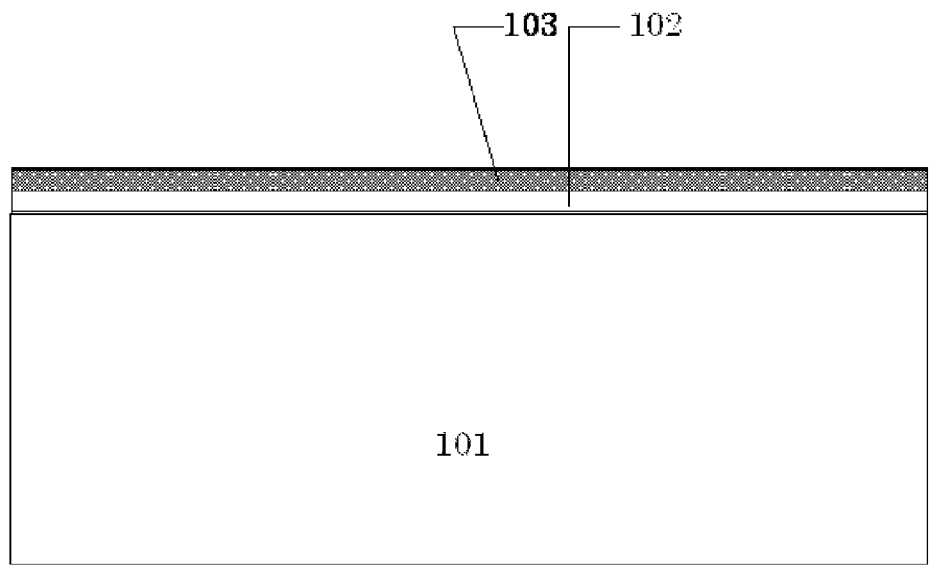
FIG. 3 to FIG. 11 illustrate the structures of the SiGe HBT in main steps of the manufacturing method of the present invention.

The manufacturing method of the SiGe HBT of the present invention will be described and specified below in combination with FIG. 2 and FIG. 3 to FIG. 11. As shown in FIG. 2, the manufacturing method of SiGe HBT includes:

Step S1: as shown in FIG. 3, grow an oxide layer 102 on a silicon substrate 101, and deposit a silicide 103 on the oxide layer 102.

Figure 4:
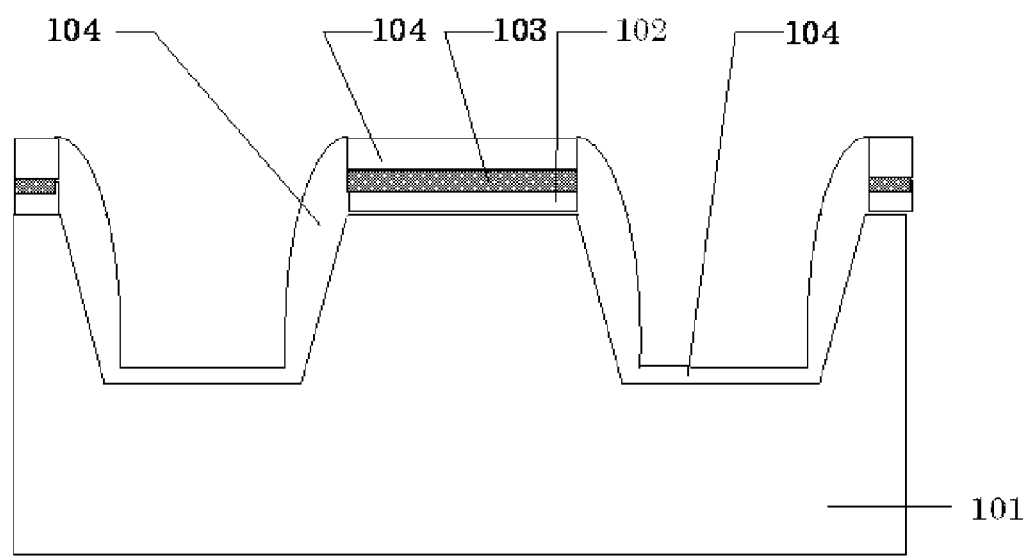

Step S2: as shown in FIG. 4, form shallow trenches by photolithography and etch to isolate an active area, and deposit an oxide 104 on the surface of the silicon substrate 101, namely, on the surface of the silicide 103 and on sidewalls and bottom of each shallow trench.

Figure 5:
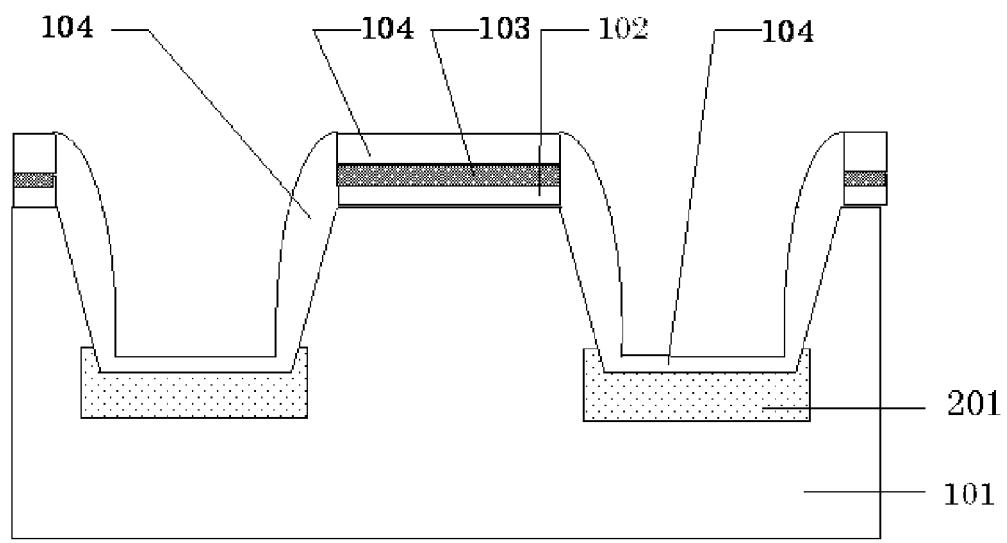

Step S3: as shown in FIG. 5, perform N-type heavily doped implantation to form a heavily doped pseudo buried layer 201 at the bottom of each shallow trench, wherein the impurity doped may be phosphorus; a dose of the implantation may be from $1\ e^{14}\ cm^{-2}$ to $1\ e^{16}\ cm^{-2}$; and an energy of the implantation may be from 2 KeV to 50 KeV.

Figure 6:
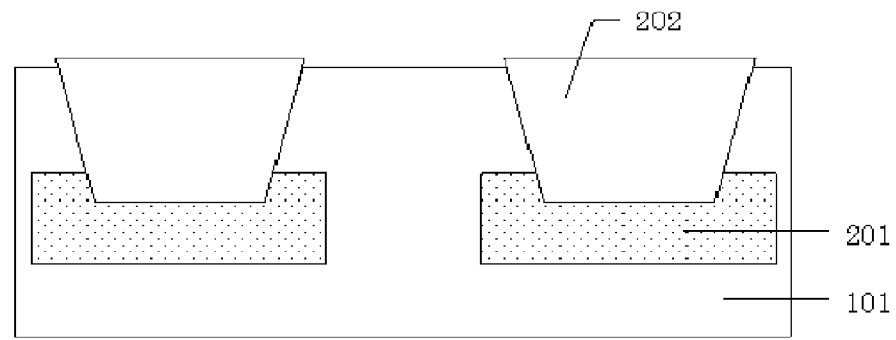

Step S4: as shown in FIG. 6, fill an oxide into each shallow trench, and then form shallow trench field oxides 202 by etching, grinding and thermal treatment process.

Figure 7:
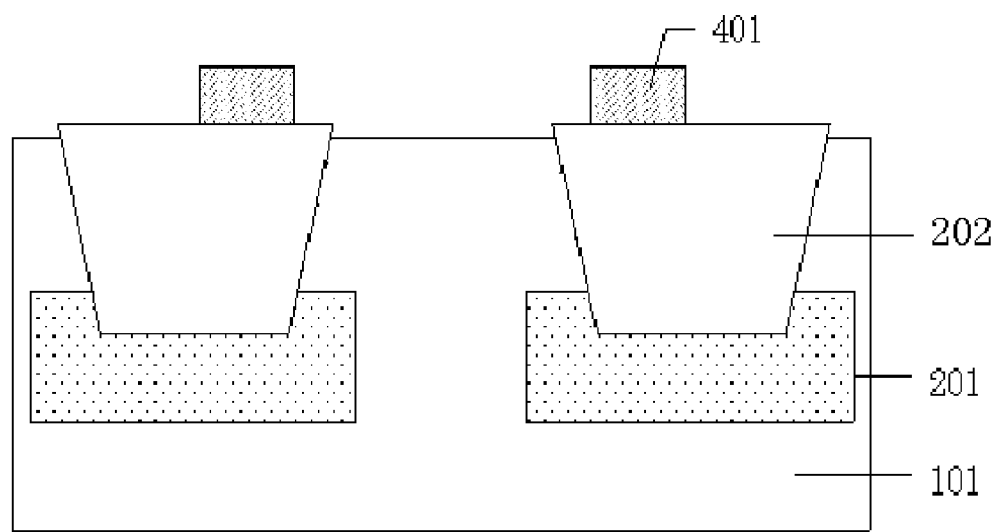

Step S5: as shown in FIG. 7, grow a gate oxide layer on the surface of the silicon substrate 101; deposit a gate polysilicon on the gate oxide layer, and form polysilicon gates 401 by etching the gate polysilicon and the gate oxide layers. The polysilicon gates 401 are formed by the process for forming polysilicon gates in a MOSFET to increase the thickness of the extrinsic base region to be formed and reduce the base region resistance.

Figure 8:
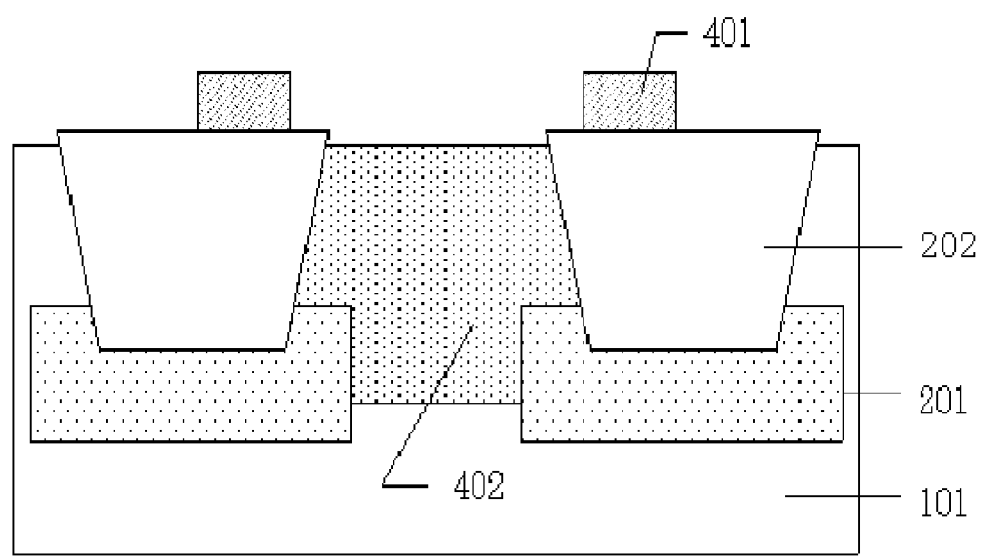

Step S6: as shown in FIG. 8, perform N-type impurity implantation to the silicon substrate 101 to form a collector region 402; the collector region 402 is sandwiched between the shallow trench field oxides 202 and between the pseudo buried layers 201; wherein the impurity implanted may be phosphorus or arsenic; a dose of the implantation may be from $1\ e^{12}\ cm^{-2}$ to $5\ e^{14}\ cm^{-2}$; and an energy of the implantation may be from 20 KeV to 350 KeV.

Figure 9:
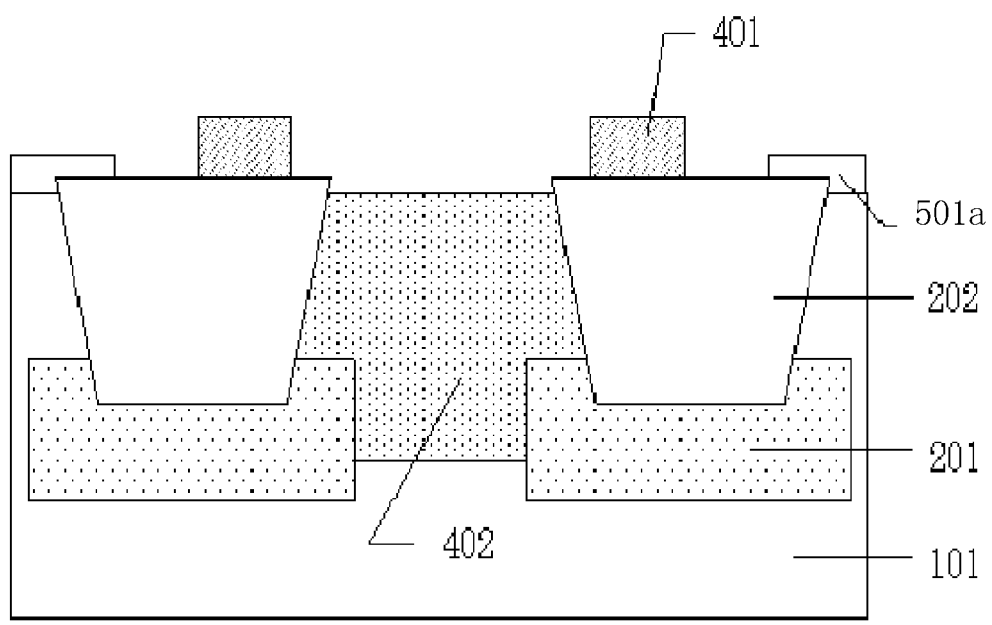

Step S7: as shown in FIG. 9, deposit an oxide dielectric layer 501a on the surface of the silicon substrate 101, and remove a part of the oxide dielectric layer 501a by etch to open an area for HBT device.

Figure 10:
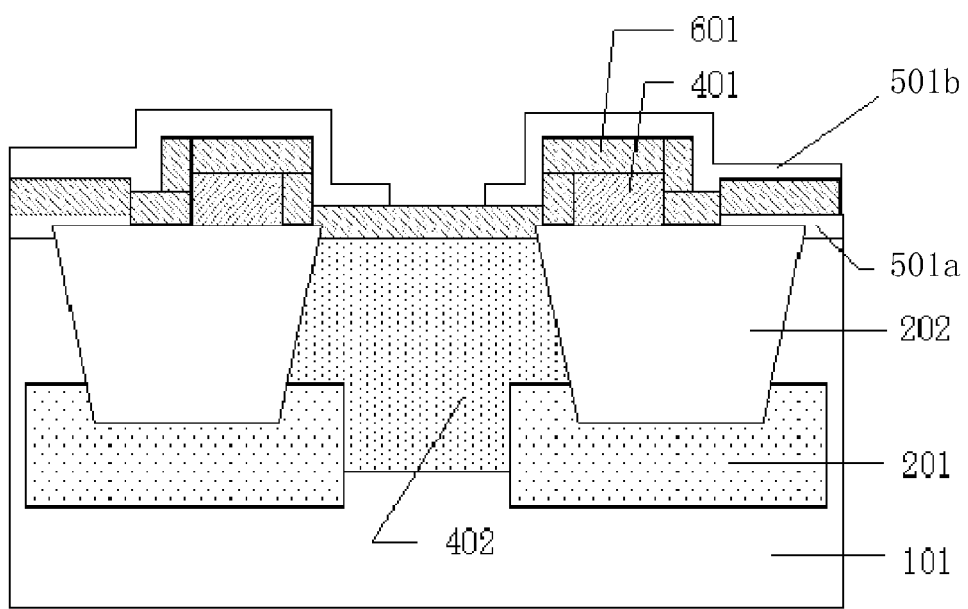

Step S8: as shown in FIG. 10, grow a SiGe epitaxial layer 601 with a thickness of less than or equal to 1000 Å on the surface of the silicon substrate 101; deposit another oxide dielectric layer 501b on the SiGe epitaxial layer 601, and remove a part of the oxide dielectric layer 501b by etch to open an emitter window.

Figure 11:
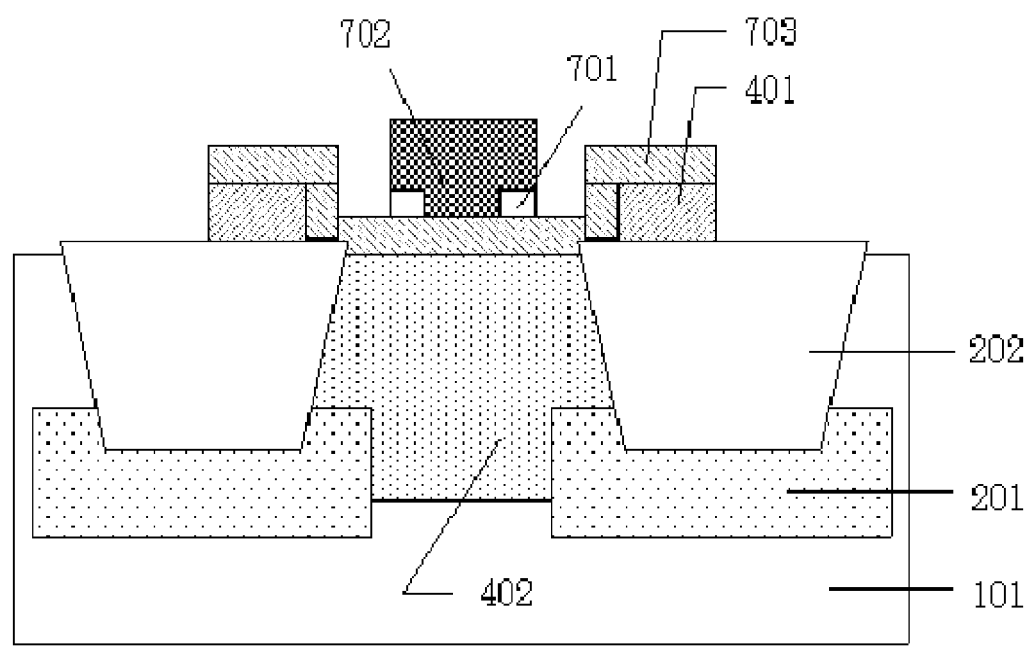

Step S9: as shown in FIG. 11, deposit a polysilicon and implant it with an N-type impurity, the impurity implanted may be phosphorus or arsenic; a dose of the implantation may be greater than $1\ e^{15}\ cm^{-2}$; then form an emitter region 702, emitter region isolation oxides 701 and a base region 703 by performing photolithography and etch to the N-doped polysilicon, the oxide dielectric layer 501b and the SiGe epitaxial layer 601, respectively; then implant a P-type impurity into a part of the SiGe epitaxial layer 601 that is not covered by the emitter region 702 (namely, the extrinsic base region), wherein the P-type impurity may be boron or boron fluoride, a dose of the implantation may be greater than $1\ e^{15}\ cm^{-2}$.

Step S10: referring to FIG. 1, deposit a silicon oxide layer, and form emitter region spacers 704 by dry etch;

Step S11: pick up each pseudo buried layer 201 through a deep contact hole 801 and connect it to a respective metal wire 803; pick up the base region 703 and the emitter region 702 by contact holes 802 and connect them to the respective metal wires 803.

The above embodiments are provided for the purpose of describing the invention and are not intended to limit the scope of the invention in any way. It will be apparent to those skilled in the art that various modifications and variations can be made without departing from the spirit or scope of the invention. Thus, it is intended that the present invention cover the modifications and variations of this invention.

What is claimed is:

1. A method of manufacturing SiGe HBT (Heterojunction Bipolar Transistors), comprising the following steps in the sequence set forth:
    forming shallow trenches in a silicon substrate;
    forming a pseudo buried layer at a bottom of each of the shallow trenches;
    filling an oxide into each of the shallow trenches to form shallow trench field oxides;
    forming a polysilicon gate with a thickness of greater than 150 nm above each of the shallow trench field oxides;
    forming a collector region beneath a surface of the silicon substrate, the collector region being sandwiched between the shallow trench field oxides and between the pseudo buried layers;
    forming a base region by growing a SiGe epitaxial layer on the polysilicon gates and the collector region;
    forming emitter region isolation oxides on a part of the base region on the collector region;
    forming an emitter region on the emitter region isolation oxides and a part of the base region.

2. The method according to claim 1, further comprising forming spacers on sidewalls of the emitter region and the emitter region isolation oxides.

3. The method according to claim 1, further comprising forming deep contact holes for picking up the collector region, each of the deep contact holes being formed through the shallow trench field oxides and connecting to the respective pseudo buried layer.

4. The method according to claim 1, further comprising forming contact holes for picking up the base region and the emitter region, the contact holes being formed on the base region and the emitter region, respectively.

5. The method according to claim 1, wherein the polysilicon gates are formed by using gate polysilicon process of a MOSFET in a CMOS process.

6. The method according to claim 1, wherein the pseudo buried layer is formed by N-type heavily doped ion implantation; the impurity implanted is phosphorus; a dose of the implantation is from $1\ e^{14}\ cm^{-2}$ to $1\ e^{16}\ cm^{-2}$; and an energy of the implantation is from 2 KeV to 50 KeV.

7. The method according to claim 1, wherein the collector region is formed by N-type ion implantation; the impurity implanted is phosphorus; a dose of the implantation is from $1\ e^{12}\ cm^{-2}$ to $5\ e^{14}\ cm^{-2}$; and an energy of the implantation is from 20 KeV to 350 KeV.

8. The method according to claim 7, wherein the emitter region is formed by an N-doped polysilicon; the N-type impurity doped is phosphorus or arsenic; a dose of the doping is greater than $1\ e^{15}\ cm^{-2}$.

9. The method according to claim 1, wherein the SiGe epitaxial layer has a thickness less than or equal to 1000 Å.

10. The method according to claim 1, further comprising performing P-type doping to a part of the SiGe epitaxial layer not covered by the emitter region; the P-type impurity is boron or boron fluoride; a dose of the doping is greater than $1\ e^{15}\ cm^{-2}$.

* * * * *